United States Patent [19]
Kivari

[11] Patent Number: 5,365,119
[45] Date of Patent: Nov. 15, 1994

[54] CIRCUIT ARRANGEMENT

[75] Inventor: Raimo Kivari, Haukipudas, Finland

[73] Assignee: Nokia Mobile Phones Ltd., Salo, Finland

[21] Appl. No.: 928,982

[22] Filed: Aug. 12, 1992

[30] Foreign Application Priority Data

Aug. 15, 1991 [FI] Finland .................................. 913862

[51] Int. Cl.$^5$ ............................................. H03K 5/06
[52] U.S. Cl. .................................... 327/115; 377/47; 327/175
[58] Field of Search ....................... 307/265, 267, 271; 328/15; 377/47

[56] References Cited

U.S. PATENT DOCUMENTS

| | | | |
|---|---|---|---|
| 3,938,009 | 2/1976 | Gauthier . | |
| 4,278,061 | 7/1981 | Werner et al. | 307/267 X |
| 4,694,197 | 9/1987 | Sprague | 307/269 |
| 4,935,944 | 6/1990 | Everett | 377/48 |
| 5,003,194 | 3/1991 | Engelhard | 307/265 |
| 5,163,168 | 11/1992 | Hirano et al. | 307/265 |
| 5,172,400 | 12/1992 | Maemura | 377/47 X |
| 5,231,320 | 7/1993 | Kase | 307/265 X |

FOREIGN PATENT DOCUMENTS 0247769 12/1987 European Pat. Off. .
0473251A1 3/1992 European Pat. Off. .

OTHER PUBLICATIONS

Electronic Engineering, Jun. 1979, p. 35, Applied Ideas, "Three-phase clock from reference clock using TTL", Afzal, Mohammed.
EDN, 13 Oct. 1988, p. 254, Design Ideas.

Primary Examiner—Willis R. Wolfe
Attorney, Agent, or Firm—Perman & Green

[57] ABSTRACT

A signal generator includes a frequency divider having an input node for receiving a first signal having a first frequency $f_1$ and a single output node for outputting a second signal having a second frequency $f_2$, wherein a ratio $f_1/f_2$ is equal to an odd number that is equal to or greater than three. A synchronous delay circuit has an input node coupled to the single output node of the frequency divider and an output node for outputting a third signal that is delayed in time with respect to the second signal by an amount that is a function of a period of the first signal. Logic is provided having a first input node coupled to the single output node of the frequency divider and a second input node coupled to the output node of the delay circuit. The logic has an output node for outputting a fourth signal having the second frequency $f_2$ and a 50% duty cycle. In a further embodiment the signal generator outputs a frequency that is $(2n+1)/2$ of the input frequency, where n any positive integer.

4 Claims, 3 Drawing Sheets

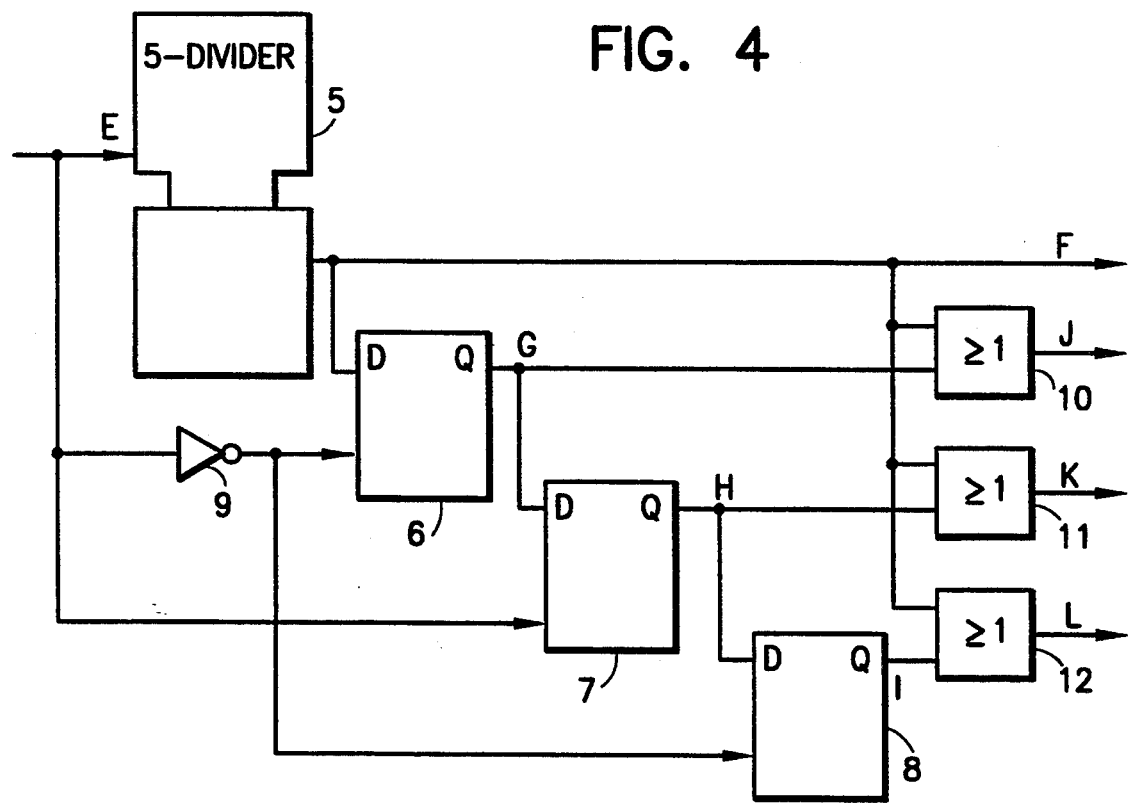
FIG. 4
FIG. 5
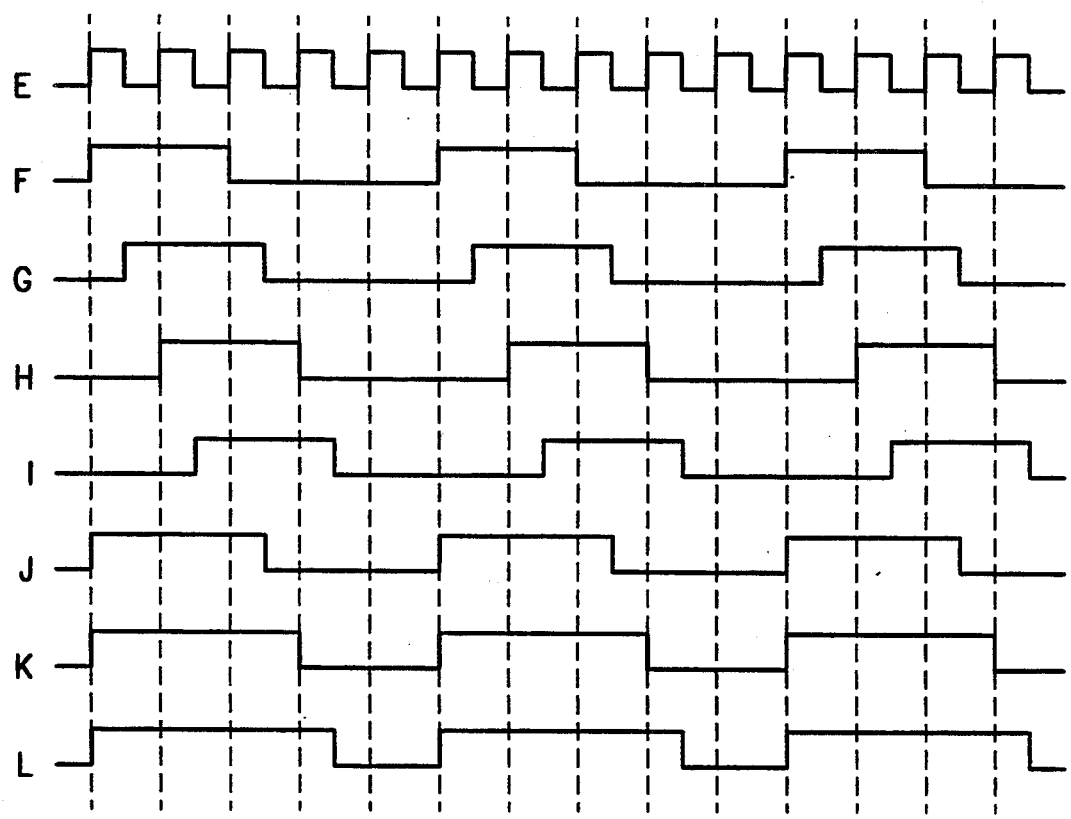

CIRCUIT ARRANGEMENT

FIELD OF THE INVENTION

The present invention relates to a circuit arrangement for changing the duty cycle of an input cycle and a divider incorporating such a circuit arrangement for dividing the frequency of an input clock signal by odd numbers and decimal numbers. The invention relates to digital technology and pulse technology.

BACKGROUND OF THE INVENTION

Means for dividing input clock frequencies by even numbers are generally known. Using these means, a desired 50% duty cycle can be achieved. By duty cycle, there is meant the ratio of the time for which a signal is "high" to the time it is "low" in one cycle i.e. for a 50% duty cycle a signal is "high" 50% of the time i.e. the mark-to-space ratio is unity.

Dividing frequencies by odd numbers is known and various means of such division exist. However, the means of the prior art are usually encumbered with the restriction that the duty cycle of the output signal is not 50%, but it is above or below 50% by at least one clock cycle of the input frequency or it is asynchronous. One such solution is presented in the European Patent Application, Publication No. 247,769. If the ratio R between the input clock frequency and the output clock frequency is relatively low i.e. less than 11 to 15, a programmable counter with a duty cycle of 1/R can be used for frequency division when the input clock frequency is less than 10 MHz. If the ratio R is high, the input clock frequency must be relatively low, 1 to 2 MHz at most. In both instances the duty cycle is 1/R unless additional decoding logic is used.

When the ratio R is high, several consecutive dividers, or counters, can be used for frequency division. If the counters act synchronously, i.e. the clock inputs of the flip-flops of the counters are connected directly to the same clock so that no propagation delays arise, the duty cycle is always 1/R. The desired frequency can also be generated by adding a completely new frequency into the system. An extra local oscillator is, however, required in such instances.

Another problem has been, that to date it has been difficult to get the output signal synchronized. The output signal is often expected to be symmetrical, and for instance, in order to exclude any phase jitter or other distortions, at least the leading edges should be evenly spaced, as should also the trailing edges. No generally known appropriate means exist for this purpose.

Division with odd numbers has generally been abandoned. A great number of oscillators of different frequencies have been adopted. This involves extra component costs.

In addition to dividing by odd numbers there is often a need to divide by decimal numbers. One such implementation is presented in the U.S. Pat. No. 4,935,944, but this solution has the drawback that the circuit includes feedback loops, which cause delays.

SUMMARY OF THE INVENTION

According to the present invention, there is provided a circuit arrangement for changing the duty cycle of an input signal, the circuit arrangement comprising means for generating a second signal having the same frequency as the input signal but out of phase therewith, and means for combining the input signal and the second signal to generate an output signal therefrom, such that the output signal has the same phase and frequency as the input signal but a different duty cycle.

This has the advantage that means for arbitrarily forming a signal duty cycle is provided. This previously not having been possible.

This circuit can be incorporated into a divider whereby the output from a known dividing means is provided as the circuit arrangement input signal so that the output of the divider i.e. the output from the circuit arrangement has the required duty cycle. Thus, frequency division by an odd number may be achieved which has a 50% duty cycle i.e providing an outgoing symmetrical waveform. If the duty cycle is 50%, the output of the circuit can be used for clock frequencies of large circuits both on the leading and the trailing edge, and, no problems are caused by deviations between the leading edges and trailing edges.

Thus with the aid of a circuit arrangement in accordance with the invention, a clock frequency may be obtained from an input clock frequency when the ratio R between the input clock frequency and the output clock frequency is an odd integer. It was possible earlier, with the aid of a programmable synchronous counter, to produce the same input signal and output signal ratio, but the duty cycle has not been close to 50%, especially in high ratios. If the ratio R is an even integer, the output of the counter to be programmed can always be divided with two so that the duty cycle remains the same.

Division with any odd number is therefore possible using a small amount of logic. Dividers can therefore be provided which were not implementable earlier or in which the implementations have been utterly cumbersome and case-bound. With the present invention a synchronous output signal can be produced.

The second signal generating means may comprise at least one delay flip-flop coupled together, the clock signals of which are provided from the same signal. This same signal may be the divider input signal.

Thus a completely synchronous clocked operation can be produced and therefore no propagation delays arise. The input clock is not provided with a gate, and no asynchronic resetting of the memory elements is employed. Therefore, the tests can be carried out also on e.g. the SCAN principle.

The circuit arrangement and divider in accordance with the invention are not dependent on asynchronic delays or the layout of the wiring. The timings are accurate and the system is not subject to great delay variations caused by the parameters. No feedback is included so that no delay caused by feedback takes place in normal operation, and its testability is easier.

There are a minimal number of input and output signals. Also a delay from the input to the output is minimal so that the design is expedient also in very high frequencies.

BRIEF DESCRIPTION OF THE DRAWINGS

Embodiments of the invention will now be described, by way of example only, with reference to the accompanying drawings, of which:

FIG. 4 is a circuit diagram of a second embodiment of the invention;

FIG. 5 illustrates the pulse patterns generated by the circuit of FIG. 4;

DETAILED DESCRIPTION OF THE INVENTION

Figure 1:
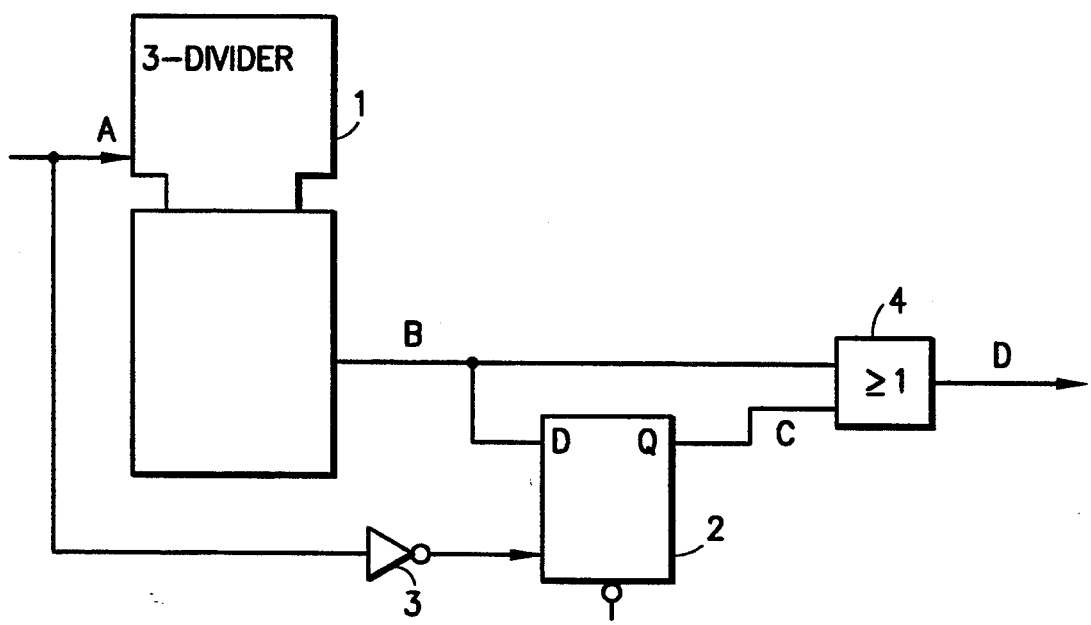
FIG. 1 is a circuit diagram of a first embodiment of the invention.

FIG. 1 is a circuit diagram of an apparatus which divides, symmetrically, the frequency of an input signal by three. The incoming signal A, having a predetermined frequency, is first divided into an asymmetrical output signal B with the aid of a three-divider 1, i.e. it divides the frequency of the incoming signal A by three to provide the output signal B which has a frequency one-third that of signal A. The signal B from the divider 1 is delayed in a flip-flop 2, to provides signal C, which has the same frequency but a different phase than signal B, as the output. The clock signal of the flip-flop 2 is provided by coupling the incoming signal A to the second input of the flip-flop 2 via an inverter 3. The resultant signals B and C from the three-divider 1, and the flip-flop 2 respectively, are combined with the aid of a logic gate 4, whereby an output signal D, having a frequency which is a third of the input signal A, and the required duty cycle is obtained. The logic gate 4 may be an AND gate or an OR gate depending upon the duty cycle of the output signal B and the phase-shift between output signals B and C to provide the output signal with the required duty cycle. In this embodiment, signal D has a 50% duty cycle. Because symmetrical division cannot be made with odd numbers merely utilizing one edge of an input clock, such as the leading edge, the phase-shifted output signal C must be timed to be at the other edge of the input clock, the trailing edge in this case, with the aid of the inverter 3.

It is usually most relevant to carry out the asymmetrical division in the divider 1 so that the duty cycle of the output signal B is as close to 50% as possible, so that the phase shift simply means a shift to the other edge of the input clock. The asymmeterical division can be carried out using dividers already known to persons skilled in the art.

Figure 2:
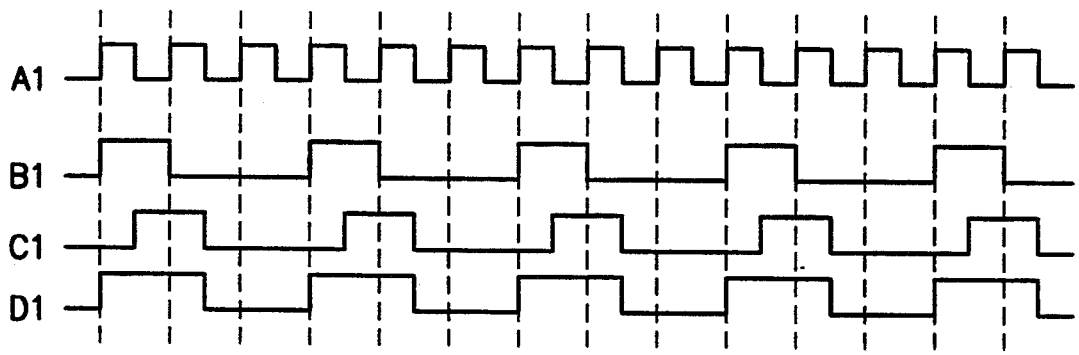
FIGS. 2 and 3 illustrate the pulse patterns generated by the circuit of FIG. 1.

FIG. 2 illustrates pulse patterns of the signals A,B,C & D for symmetrical division by three using the circuit of FIG. 1 when the duty cycle of the three-divider 1 is ⅓. The logic gate 4 is an OR gate. A1 refers to incoming clock signal, B1 to the output signal of the divider, C1 to the delayed signal output from the flip-flop 2, and D1 to the resultant output signal as output from the OR gate 4.

Figure 3:
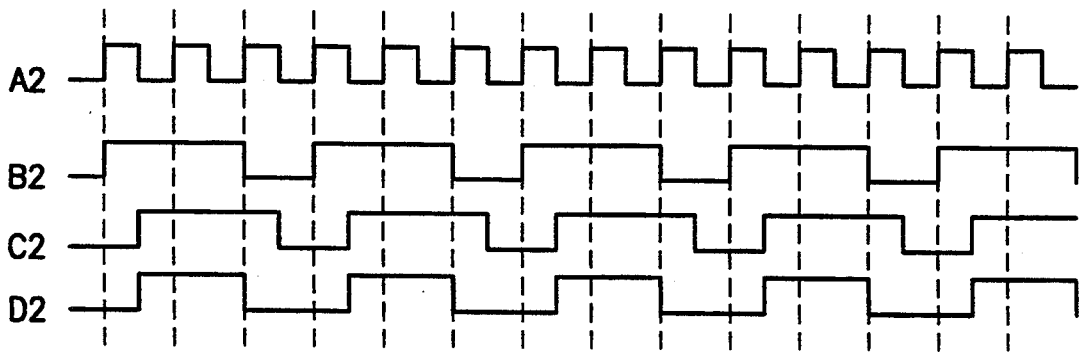

The pulse patterns illustrated in FIG. 3 relate to the symmetrical division by three using the circuit of FIG. 1 when the duty cycle of the divider 1 is ⅔, and an AND gate is used instead of an OR gate. A2 is the input clock frequency, B2 the output signal of the divider, C2 the delayed signal of the divider, and D2 the output frequency.

Whatever odd number is selected as division number for the asymmetrical divider 1, its output can be made to have the required duty cycle by comparing it with a similar phase shifted signals. If the original duty cycle is appropriate, phase shifts of different lengths and different ways of combining the signals are selected to provide the required output.

The principle for controlling any arbitrary duty cycle described above can be generalized, in that by means of various phase shifts and by appropriate combinations, the duty cycle can either be decreased or increased.

FIG. 4 shows a circuit diagram for dividing the frequency of an input signal by five. An input clock signal E having a predetermined frequency is first divided into an asymmetrical output signal F with the aid of a five-divider 5. The output signal F, with 40% duty cycle, is input to a flip-flop 6, into which the input clock signal E has also been input via an inverter 9 as the flip-flop 6 clock signal and an output signal G, with the same frequency as the output signal F but with a different phase, is obtained as an output. The signal G is input to a flip-flop 7, into which the input clock signal E has also been input as the flip-flop 7 clock signal whereby an output signal H which is also out of phase with output signal G is obtained. This output signal H is likewise delayed in a flip-flop 8, into which the output from the inverter 9 is also input as the flip-flop 8 clock signal whereby the output signal I of different phase is obtained. The signals F and G are combined with the aid of an OR gate 10, to obtain an output signal J having a 50% duty cycle with a frequency one-fifth that of the input signal E.

To obtain output signals having a duty cycle greater than 50%, the signals F and H are combined with the aid of an OR gate 11 and the signals F and I with the aid of an OR gate 12, whereby an output signal K having a 60% duty cycle and an output signal L having a 70% duty cycle respectively are obtained. The pulse patterns E to L are shown in FIG. 5.

It can be seen from this that by having a similar circuit, but without the divider, a circuit can be provided for controlling the duty cycle of any signal.

The circuit arrangement in accordance with the invention may also be applied to provide a divider which divides the frequency of an input signal by $(2n+1)/2$, where n is any positive integer i.e. by a decimal number. The divider is now of the form 1.5, 2.5, 3.5, etc.

Figure 6:
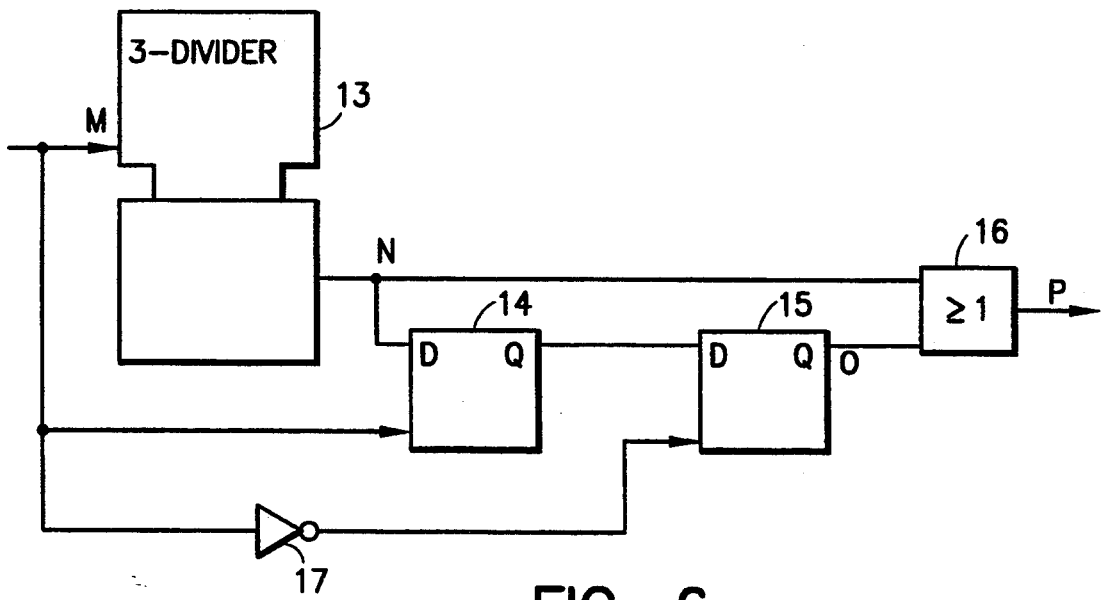
FIG. 6 is a circuit diagram of a third embodiment of the invention.

FIG. 6 shows a circuit diagram for dividing an input signal by $(2n+1)/2$ i.e. by a decimal number. The frequency of an input signal M is now first divided by $2n+1$, and then the output signal N is multiplied by two by additionally forming a phase shifted signal O and then combining with the divided signal N to provide an output signal P.

The multiplication is carried out by first forming, e.g. by delaying, a signal O of the same frequency but opposite in phase to the divided signal N. The frequency is then multiplied by combining these two signals N, O having different phases in an appropriate manner to form an output signal P. This output signal P has a frequency equal to the frequency of the input signal M divided by a decimal number i.e. by $(2n+1)/2$. The duty cycle of the output signal is no longer 50% but the leading edges are mutually evenly spaced, as are the trailing edges. In digital applications in which a signal is merely used for clocking, this is usually sufficient.

If we want, for example, to divide an input frequency by 1.5, the frequency of the input signal M is first divided by 3 (i.e. 1.5 multiplied by 2) in a three-divider 13 and the output signal N is then multiplied by two with the aid of phase shifting. The output signal N is delayed by one clock frequency with the aid of a flip-flop 14 which has the input signal M as its clock input. The output from the flip-flop 14 is then delayed by a half clock cycle with the aid of a flip-flop 15 the clock input of which is the input clock signal M coupled via an inverter 17. The resultant signals N and O are combined with the aid of an OR gate 16 to obtain the desired output signal P whose frequency is the input clock frequency divided by 1.5. Division with a doubled number has to be done because no ways are known of how to carry out a division directly with a number $(2n+1)/2$.

Figure 7:
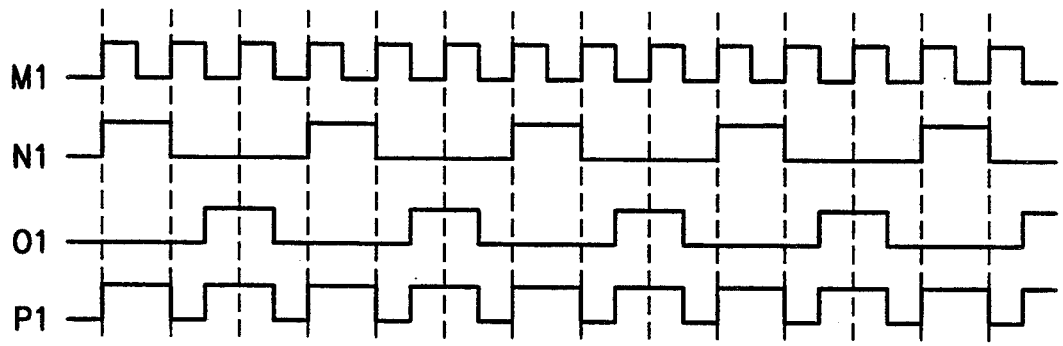
FIGS. 7 and 8 illustrate pulse patterns generated by the circuit of FIG. 6.

FIG. 7 shows the pulse patterns generated by the circuit of FIG. 6 where division is by 1.5. M1 is the input clock frequency, N1 the output signal of the divider, 01 the delayed signal obtained from flip-flop 15, and P1 the output frequency.

Figure 8:
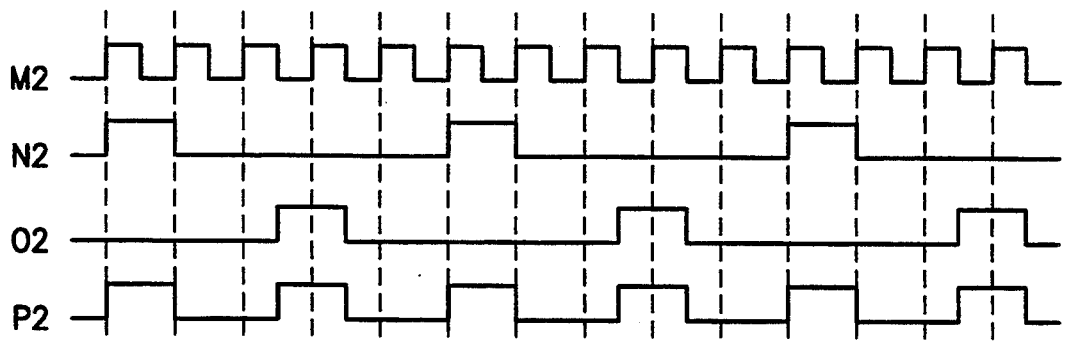

Similarly, FIG. 8 shows the pulse patterns generated when dividing by 2.5. The circuit diagram is now similar to that in FIG. 6, but the divider 13 is a five-divider and instead of one flip-flop 14 two series connected flip-flops are used. M2 is an input clock frequency, N2 the output signal of the divider, 02 the delayed signal obtained from flip-flop 15 and P2 the output frequency.

The principle of the design can be generalized by initially dividing an input signal $Y*(2n+1)/2$, and then by multiplying the frequency of the divided signal by Y. The value of 2 for Y most often gives the easiest and most economical implementation with regard to the amount of the logic.

It is to be noted that the principle of the invention may also be applied to dividing by odd numbers. In this case, the input frequency is first divided by $(2n+1)/2$ in accordance with the said afore presented principle, and the output frequency is then divided by 2. This division can be done by known methods, for example using a toggle-type flip-flop or a D-type flip-flop. However, the principle of dividing with odd numbers as described above is in general more useful and synchronous.

It is also possible to connect dividers in succession by using the output clock of a former divider for the input clock of a divider following thereafter. In this manner, almost any arbitrary division ratios can be formed. For instance, by connecting a 2.5 divider and a 3.5 divider in succession, a division with 8.75 is obtained. By then adding a 4.5 divider thereto, a division with 39.375 is obtained. When dividers are connected in succession, the duty cycle of the output of each divider is determined in the connection by the duty cycle of the clock obtained from the divider preceding in the connection. In each case, either a symmetrical or asymmetric output is obtained from the last divider.

Asymmetric output frequencies may be rendered symmetrical according to the invention by using the principle of controlling the pulse or, for example, according to a principle known in the art, by performing the division with two, which symmetrizes the output frequency, as the last operation. While connecting dividers in succession, the operation is however, partly asynchronic, i.e. the total delay from the beginning to the end increases, while increasing the difficulty of testability.

It will be evident, from the foregoing description, to a person skilled in the art, that various modifications are possible, within the scope of the present invention. For example it is also possible to carry out a phase shift e.g. with an asynchronic delay chain formed from inverters or gates. The asynchronic delay chain is, however, subject to delay variations caused by the process, voltage, temperature and the layout of the wiring. Also, the duty cycle of the output varies. One may also use two different dividers, which are in different phases, for frequency division. In this case, signals of different phases are obtained from the outputs of the dividers. The mode of implementations is otherwise useful but it requires more logic.

The most versatile implementation, though most logic consuming, is one in which the divider is made completely parameterizable as regards the division ratio and the duty cycle of the output. In this case, the divider is given in accordance with the desired division ratio an initial value which is equivalent to the desired length of the divider and similarly, an appropriate gate is selected to match the output in accordance with the presented examples for forming the final signal. The same divider can now be programmed individually for different division ratios.

I. Claim:

1. A signal generator, comprising:
   frequency divider means having an input node for receiving a first signal having a first frequency $f_1$ and a single output node for outputting a second signal having a second frequency $f_2$, wherein a ratio $f_1/f_2$ is equal to an odd number that is equal to or greater than three;
   delay means having an input node coupled to said single output node of said frequency divider means and an output node for outputting a third signal that is delayed in time with respect to said second signal by an amount that is a function of a period of said first signal, said third signal being synchronized to said first signal; and
   logic means having a first input node coupled to said single output node of said frequency divider means and a second input node coupled to said output node of said delay means, said logic means having an output node for outputting a fourth signal having the second frequency $f_2$ and a 50% duty cycle.

2. A signal generator as set forth in claim 1 wherein said delay means is comprised of a flip-flop having a clock input, a data input coupled to said single output node of said frequency divider means, and an output for outputting said third signal, and further comprising an inverter having an input node coupled to said first signal and an output node coupled to said clock input of said flip-flop.

3. A signal generator, comprising:
   frequency divider means having an input node for receiving a first signal having a first frequency $f_1$ and a single output node for outputting a second signal having a second frequency $f_2$, wherein $f_2$ is equal to $f_1$ divided by $(2n+1)$, where n is a positive integer;
   delay means having an input node coupled to said single output node of said frequency divider means and an output node for outputting a third signal that is delayed in time with respect to said second signal by an amount that is a function of a period of said first signal, said third signal being synchronized to said first signal; and
   logic means having a first input node coupled to said output node of said frequency divider means and a second input node coupled to said output node of said delay means, said logic means having an output node for outputting a fourth signal having a frequency equal to f1 divided by $(2n+1)/2$.

4. A signal generator as set forth in claim 3 wherein said delay means is comprised of a plurality of serially coupled flip-flops each having a clock input, a data input, and an output, wherein said data input of a first one of said serially coupled flip-flops is coupled to said single output node of said frequency divider means and wherein said output of a last one of said serially coupled flip-flops is coupled to said second input node of said logic means, wherein said output of each of said serially coupled flip flops, except said last one, is coupled to said data input of a next, adjacent flip-flop, and further comprising at least one inverter having an input node coupled to said first signal and an output node coupled to said clock input of at least one of said plurality of serially coupled flip-flops, wherein said clock input of at least one other one of said serially coupled flip-flops is coupled to said first signal.

* * * * *